US007820990B2

(12) United States Patent
Schroeder et al.

(10) Patent No.: US 7,820,990 B2
(45) Date of Patent: Oct. 26, 2010

(54) SYSTEM, METHOD AND APPARATUS FOR RF DIRECTED ENERGY

(75) Inventors: Wayne K. Schroeder, Mansfield, TX (US); Mark A. Turner, Arlington, TX (US); Brett A. Williams, Iowa City, IA (US)

(73) Assignee: Lockheed Martin Corporation, Bethesda, MD (US)

(*) Notice: Subject to any disclaimer, the term of this patent is extended or adjusted under 35 U.S.C. 154(b) by 218 days.

(21) Appl. No.: 12/000,298

(22) Filed: Dec. 11, 2007

(65) Prior Publication Data

US 2008/0149860 A1 Jun. 26, 2008

Related U.S. Application Data

(60) Provisional application No. 60/873,957, filed on Dec. 11, 2006.

(51) Int. Cl.
*G01R 31/26* (2006.01)

(52) U.S. Cl. .................... 250/493.1; 324/765; 324/750; 324/753

(58) Field of Classification Search .............. 250/493.1, 250/505.1; 324/765, 750, 753
See application file for complete search history.

(56) References Cited

U.S. PATENT DOCUMENTS

| | | | |
|---|---|---|---|
| 4,556,790 A | 12/1985 | Glass et al. | |
| 5,858,799 A | 1/1999 | Yee et al. | |
| 6,851,645 B1 | 2/2005 | Williams et al. | |
| 2003/0164947 A1 | 9/2003 | Vaupel | |
| 2009/0224155 A1 * | 9/2009 | Williams | 250/336.1 |

OTHER PUBLICATIONS

Barnes, William L., et al. "Surface Plasmon Subwavelength Optics." Nature, vol. 42d, Aug. 14, 2003, pp. 824-830.

* cited by examiner

*Primary Examiner*—Kiet T Nguyen
(74) *Attorney, Agent, or Firm*—Buchanan Ingersoll & Rooney PC

(57) ABSTRACT

Systems and methods are disclosed for emitting electromagnetic (EM) energy. A source emits EM energy that is incident on a first material. The first material transmits EM energy to a second material. The second material can have a first surface adjacent to the first material and a thickness and shape selected to stimulate surface plasmon polaritons on the first surface of the second material to resonate the EM energy transmitted from the first material such that the resonated EM energy has an EM wavelength in a narrow field of view with substantially no sidelobes.

17 Claims, 8 Drawing Sheets

SYSTEM, METHOD AND APPARATUS FOR RF DIRECTED ENERGY

CROSS REFERENCE TO PRIOR APPLICATIONS

This application claims the benefit of priority of provisional application No. 60/873,957 filed on Dec. 11, 2006, the entire content of which is hereby incorporated by reference.

BACKGROUND

1. Field

Systems and methods are disclosed for emitting electromagnetic (EM) energy.

2. Background Information

Surface plasmon polaritons are surface plasmons associated with incident light waves that result when free space electromagnetic waves couple to free electron oscillations (surface plasmons) in metal. Surface plasmon polaritons are lightwaves trapped on a conductive metal surface due to their interactions with electrons on the conductive metal surface.

Metal supports collective surface oscillations of free electrons. These collective surface oscillations can concentrate electromagnetic fields on the nanoscale, enhancing local field strength in a particular direction by several orders of magnitude. Plasmon characteristics can be accessed at optical and radio wavelengths. Normal propagating electromagnetic (EM) waves have constant phase and amplitude in the same plane. Surface plasmons and surface plasmon polaritons have planes of constant phase perpendicular to those of constant amplitude, i.e. both are forms of evanescent waves.

The primary responders to EM waves are electrons followed by polar molecules. Even low inertia electrons can fail to keep up with high frequencies depending on material used in constructing a detector. The dependence on material is described by the index of refraction (or dielectric constant or relative permittivity) and is a function of EM frequency.

This dependence on index of refraction and on frequency (or wavelength) is called a "dispersion relation". Surface plasmons on a smooth planar metal display non-radiative electromagnetic modes; i.e., the surface plasmons cannot decay spontaneously into photons nor can light be coupled directly with surface plasmons.

The reason for this non-radiative nature of surface plasmons is that interaction between light and surface plasmons cannot simultaneously satisfy energy and momentum conservation; the conservation of parallel momentum is not satisfied as represented by the momentum wave-vector, k (where the magnitude of $k=2\pi/\lambda$, with $\lambda$ being the EM wavelength). When surface plasmons and light are made to be in resonance, the result is a "surface plasmon polariton". The surface plasmon polariton is an electromagnetic field in which both light and electron wave distributions match in their momentum vector, i.e. they have the same wavelength. This is also true for non-optical EM energy, e.g., radio waves.

Resonance and field enhancement can be made to take place if the electromagnetic momentum wave vector is increased as in a transparent medium with an index of refraction, n, to match incident EM energy to the surface plasmon momentum Wave-vector, or inversely, resonance can be achieved by roughening the metal surface to impose a surface impedance (i.e. along the dielectric/metal interface) in order to match free space electromagnetic waves to surface plasmons. In practice, momentum restrictions can be circumvented either by a prism coupling technique to shorten electromagnetic wavelength or by a metal surface grating, nanostructures such as holes, dimples, posts or statically rough surfaces. This resonance results in the fields associated with moving electron collections enhancing that of electromagnetic waves at the matched wavelength.

There are a number of known ways in which to create surface plasmon polaritons. For example, the Kretchmann-Rather attenuated total reflection configuration includes a dielectric prism mated with a thin metal film. For the Kretchmann-Rather configuration, a plasmon does not ride on the dielectric/metal interface. Plasmons arise instead on the back, metal/air interface. Once EM waves incident on the dielectric/metal interface exceed the so-called critical angle of total internal reflection they establish evanescent waves, which penetrate the metal film to some skin depth. Such light induced evanescent waves excite surface plasmon polaritons on the side of the metal opposite the dielectric.

SUMMARY

Disclosed is an exemplary system for emitting electromagnetic (EM) energy, comprising a source of EM energy, a first material that transmits incident EM energy emitted from the source; and a second material. The second material has a first surface adjacent to the first material and a thickness and shape selected to stimulate surface plasmon polaritons on the first surface of the second material adjacent the first material to resonate the EM energy transmitted from the first material such that the resonated EM energy has an EM wavelength in a narrow field of view with substantially no sidelobes.

Also disclosed is an apparatus for emitting electromagnetic (EM) energy, comprising a first material that receives EM energy from an EM source, and a second material that receives the EM energy from the first material. A first surface of the second material includes an interface configured to resonate the EM energy received via the first material and to stimulate surface plasmon polaritons on a second surface of the second material in response to the EM energy.

Also disclosed is an exemplary method for illuminating a target, comprising supplying EM energy from an EM source. The EM energy is focused into a narrow beam by using EM energy to stimulate surface plasmon polaritons on a metal layer located adjacent at least one dielectric layer.

DESCRIPTION OF THE DRAWINGS

Exemplary embodiments will be described in relation to the following figures wherein.

DETAILED DESCRIPTION

Figure 1:
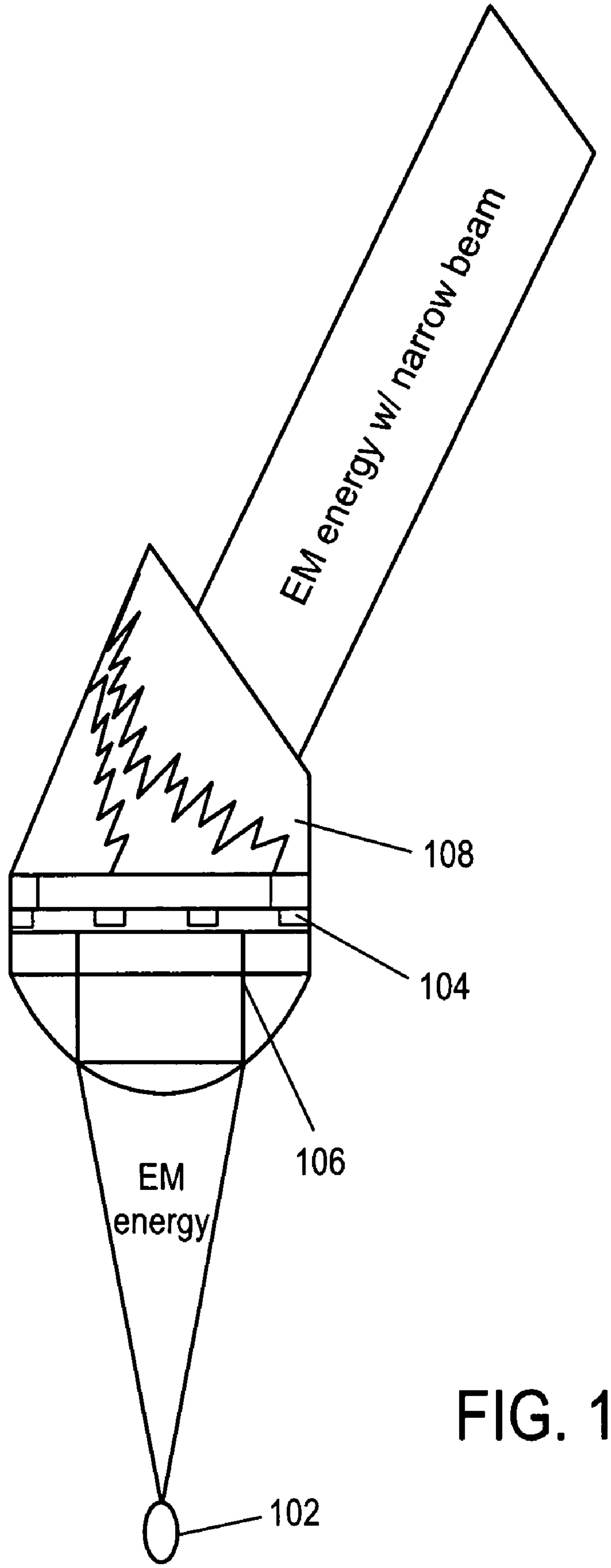
FIG. 1 illustrates an exemplary embodiment of an apparatus for emitting electromagnetic (EM) energy.

FIG. 1 illustrates an exemplary apparatus 100, such as an antenna, for emitting electromagnetic (EM) energy. The apparatus comprises a source of EM energy 102. A first material, such as an input dielectric layer 106, is provided to transmit incident EM energy emitted from the EM source. The first material is thus configured (e.g., shaped, sized and positioned relative to the EM source and to other components of the apparatus 100) to receive EM energy from the EM source. The input dielectric layer 106 can be a collimator such as a Duroid, on other material having similar characteristics.

A second material, such as a metal layer 104, has a first surface adjacent a second material having a first surface adjacent to the first material and a thickness and shape selected to stimulate surface plasmon polaritons on the first surface of the second material adjacent the first material to resonate the EM energy transmitted from the first material such that the resonated EM energy has an EM wavelength in a narrow field of view with substantially no sidelobes. The second material is thus configured (i.e., shaped of an appropriately selected material, sized and positioned) relative to the first material to receive EM energy from the first material. With this configuration, the first surface of the second material includes an interface configured to resonate the EM energy received via the first material and to stimulate the surface plasmon polaritons on a second surface of the second material in response to the EM energy.

While the first sidelobes of traditional, non-tailored, uniformly illuminated circular apertures are 17 dB below their main beam peak, exemplary embodiments described herein can include plasmonic enhanced apertures that provide an additional 13 dB or greater, i.e. −30 dB first sidelobes under the same conditions.

A third layer, such as an output dielectric layer 108, can also be provided. The output dielectric layer 108 can be a collimator, such as a Duroid, prism, air, vacuum, or other material having similar characteristics, that is configured to refract EM energy transmitted from the metal layer 104 towards a target.

The metal layer 104 can be a metal such as silver, gold, or aluminum or an alloy. Besides metals like silver, gold or aluminum, polaritons as employed by this application may also propagate in semiconductor materials and doped semiconductor materials as long as their charge density results in a plasma frequency at least sqrt (2) times that of the incident frequency of interest, thus resulting in a permittivity real part less than negative one. Intrinsic semiconductors, such as Germanium, provide change densities high enough that a negative index can be satisfied below 10 GHz radio frequencies, while doped materials like 4H—SiC doped with $2\times10^{17}$ $cm^{-3}$ nitrogen donor atoms at 300K more than satisfy a negative index well above 10 GHz radio frequencies. In an exemplary optical domain, the thickness of the metal layer 104 can be within the range of approximately 20 nanometers to 80 nanometers or more or less as desired for a given application. In radio frequency applications, the metal film thickness can be 0.001 to 0.00004 inches, or more or less as desired for a given application. For example, in an application employing X-band frequency (e.g., 8-12 GHz), the thickness of the metal film can, for example, be within the range of 0.00004 inches.

The input dielectric layer 106 is adjacent to a first surface 104*a* of the metal layer 104 (e.g., in direct contact, or in sufficiently close proximity as to function in accordance with the objectives described herein). The output dielectric layer 108 is adjacent to a second surface 104*b* of the metal layer 104. Both the input and output dielectric layers 106, 108 can be implemented as a Duroid or similar medium having indices of refraction of approximately 1.5 or lesser or greater based on the desired output. The input and output dielectric layers 106, 108 can have thicknesses of approximately 0.100 inches or lesser or greater.

The lengths of the input and output dielectric layers 106, 108 and metal layer 104 can be approximately 1.25 inches in length, (or more or less) as desired for a given application and the EM energy to be transmitted therethrough and emitted as an EM wavelength. In a relatively narrow field of view (i.e., narrow relative to the field of view of the EM energy supplied from the EM source).

The metal layer 104 has a first surface 104*a* that is adjacent to the input dielectric layer 106, and a second surface 104*b* that is adjacent to the output dielectric layer 108. The metal layer 104 has a thickness selected to stimulate surface plasmon polaritons on the second surface 104*b* of the metal layer 104 for EM energy having a given EM wavelength incident on the input dielectric layer 106 beyond a critical angle (e.g., an angle of EM incidence at which surface plasmon polaritons are generated after attenuated total internal reflection from the dielectric interface creates evanescent waves in the metal). Different metals, for example, gold and silver, can be used to provide different contributions to accuracy. Gold and silver, for example, can offer a desired field of view of, for example, ±10°.

As the incident angle of the received electromagnetic energy on the outer surface of the input dielectric layer 106 increases, the amount of energy transmitted into the dielectric medium decreases and energy from the surface plasmon polaritons also decreases. When the incident angle on the outer surface (interface) of the first dielectric layer 106 (e.g. air/dielectric) increases or extends past 90°, little or no further transmission into the dielectric occurs.

To facilitate collecting EM energy, the second surface 104*b* of the metal layer 104 can be roughened in comparison to the first surface 104*a* of the metal film. The roughness of the second surface 104*b* of the metal layer 104 can be selected to produce a desired amplitude of the EM energy generated at the second surface 104*b* by the stimulated surface plasmon polaritons. This roughness can be within the range of approximately $1/500^{th}$ or $1/1000^{th}$ (or lesser or greater as desired for a given application) of the EM wavelength received at the surface of the input dielectric layer 106. The surface plasmon polaritons can serve as an intermediary of incident EM energy, i.e. surface plasmon polaritons escort energy through the metal film over a narrow range of incident angles upon the dielectric/metal interface while rejecting those incident angles outside the range of angles.

The thickness of the metal film can be less than a skin depth of a photonic evanescent wave penetrating the metal from the maximum skin depth of the photonic evanescent wave at the first interface of the dielectric layer 104 and the metal layer 104. This roughness on the second surface 104*b* of the metal layer 104 can be created by etching, lithography, grating, "sand blasting" utilizing small plastic pellets as the "sand", or other suitable methods for providing a desired roughness. The roughness can be used to generate and enhance the EM energy output by the surface plasmon polaritons. The first surface 104*a* of the metal layer 104 can be warped to provide a selected and fixed field of view, such that the resulting EM energy is focused in a narrow beam that has substantially no side lobes.

The roughness can include various characteristics that influence the EM energy output by the surface plasmon polaritons. For example, a frequency bandwidth of the output EM energy can depend on grating shape. A 10% bandwidth (±5% about center frequency) can be produced by square semiconductor gratings. Grating shape influences bandwidth by limiting momentum wave vector match (k-match) options presented to incident electromagnetic energy in much the same way as the Fourier Transform of a square pulse in the time domain produces many frequency components in the frequency domain. Each specific frequency from such a transform is a sine wave that is required when recombining all such components in order to reconstitute the square pulse. The Fourier Transform of a sine wave is, however, a sine wave. Likewise, a sine wave grating can limit a frequency over which incident EM energy can k-match to surface plasmons in order to create surface plasmon polaritons, thereby limiting bandwidth.

Figure 2A:
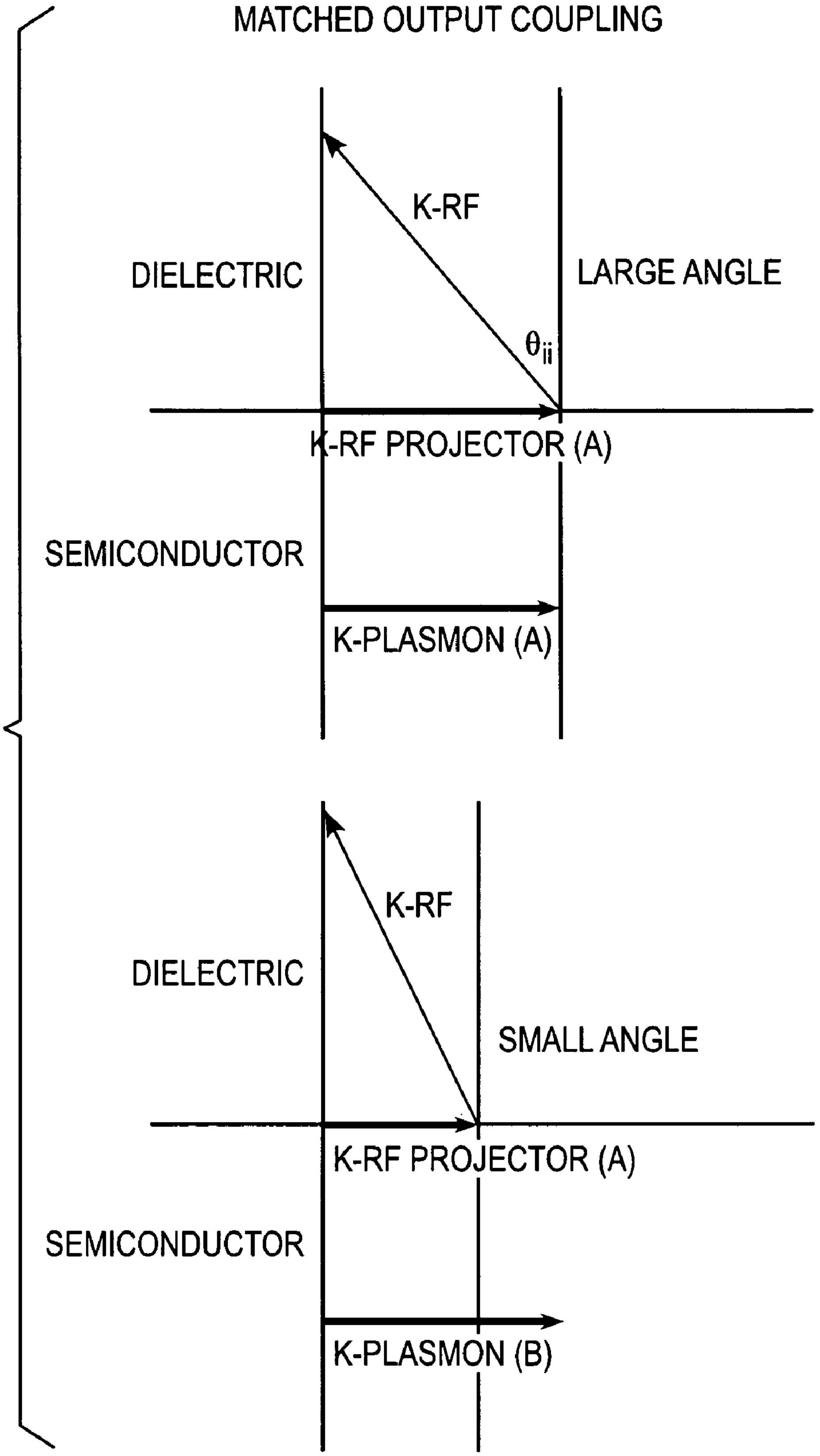
FIGS. 2A-2C illustrate EM energy coupling between material layers in accordance with an exemplary apparatus for emitting electromagnetic energy.
Figure 2B:
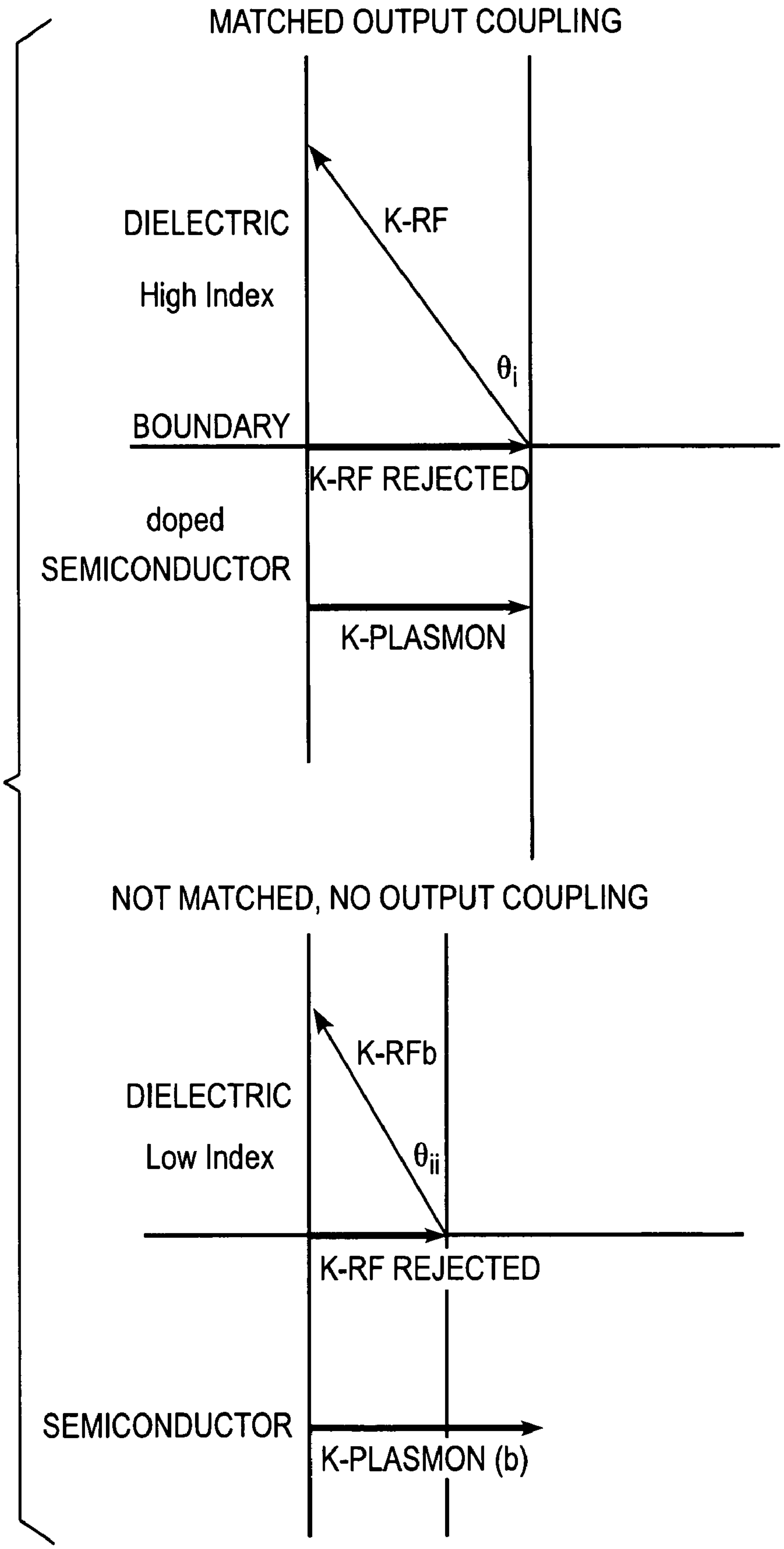
Figure 2C:
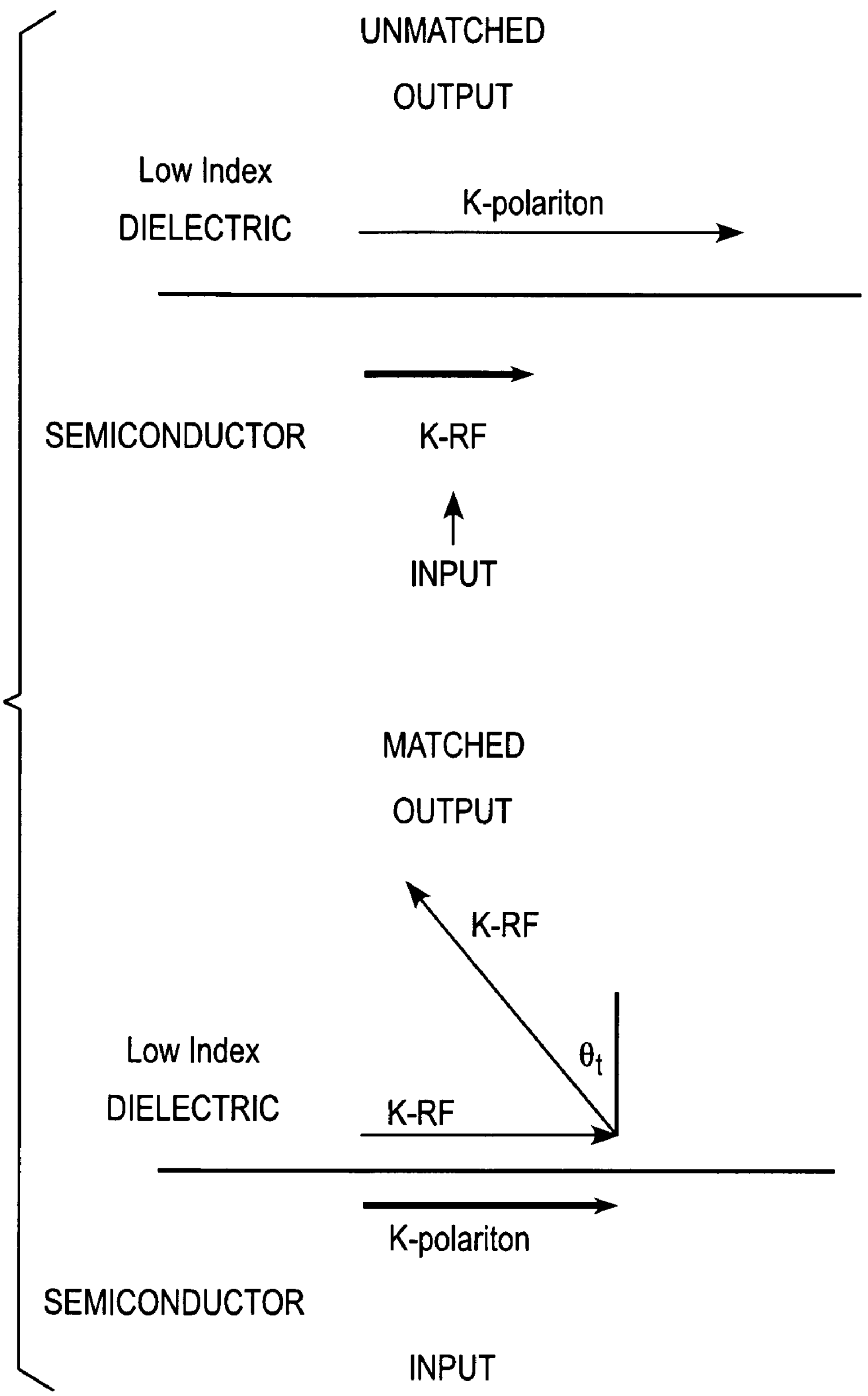

FIGS. 2A-2C illustrate EM energy coupling between either of the input and output dielectric layers 106, 108 and the metal layer 104. An output coupling of EM energy occurs when at least one momentum wave vector $k_m$ (impulse) of the EM energy traveling through the metal layer 104 matches at least one momentum wave vector $k_{od}$ of the EM energy of the output dielectric 108. Similarly, an input coupling of EM energy occurs when at least one momentum wave vector $k_{id}$ (impulse) of the EM energy traveling through the input dielectric layer 106 match at least one momentum wave vector $k_m$ of the EM energy of the metal layer 104.

As shown in FIG. 2A, the coupling of EM traveling between the metal layer 104 and the output dielectric layer 108 can be impacted by the refraction index of the output dielectric layer 108. For example, if the output dielectric layer 108 comprises a material having a low refractive index, e.g. air, the EM energy traveling between the metal layer 104 and the output dielectric layer 108 will not be matched. On the other hand, if the output dielectric layer 108 comprises a material having a high refractive index, e.g. a prism, the EM energy traveling between the metal layer 104 and the output dielectric layer 108 will couple (resonate), and thus passage of EM energy from the second surface 104*b* of the metal layer 104 to the output dielectric layer 108 can occur.

As shown in FIG. 2B, the coupling of EM energy traveling between the metal layer 104 and the output dielectric 108 can be impacted by the angle of incidence of the EM energy. For example, if the EM energy is incident on the second surface 104*b* of the metal layer 104 at an angle below $\theta_i$, then the EM energy will not enter the output dielectric layer 108 since the momentum wave vector $k_m$ of the metal layer 104 is larger than the momentum vector $k_{od}$ of the output dielectric layer 108. If the EM energy is incident on the second surface 104*b* of the metal layer 104 at an angle greater than $\theta_i$, then the momentum vector $k_{od}$ of the output dielectric 108 will be increased such that it matches the momentum vector $k_m$ of the metal layer 104. One of ordinary skill will recognize that the $\theta_i$ can be determined by the surface features of at least one of the metal layer 104 and the output dielectric layer 108.

FIG. 2C illustrates an input coupling of EM energy traveling between the input dielectric layer 106 and the metal layer 104. As shown, without the roughness (i.e. grating) being established on the first surface 104*a* of the metal layer 104 the momentum vectors k of the polaritons are longer and thus not matched to the momentum vectors of the EM energy traveling through the input dielectric layer 106. On the other hand, if the grating is established on the first surface 104*a* such that periodic surface features of the grating are sufficient to shorten the momentum vector of the polaritons, then the EM energy will traverse the first surface 104*a* into the metal layer 106. For example, for a sine-wave a momentum wave vector for a grating having a grating period $\alpha$ can be represented as $k_g=2\pi/\alpha$. There are a small set of momentum wave vectors (k) that enable the EM energy to pass between the various material layers. As such if the momentum vectors between the layers do not overlap (i.e., the EM energy fails to resonate) then the material layers will operate as a mirror.

Surface features, such as gratings, can be applied to any one or combination of the material layers (i.e., metal layer 104, input dielectric layer 106, and/or output dielectric layer 108) as desired. For example, a grating can be applied to any one or all surfaces of a material layer, such that a grating appears on a single surface of a selected material layer, both surfaces of a selected material layer, alternating surfaces of a combination of material layers, or any other application scheme as desired. While polaritons are bound only to metallic surfaces, surface features on a dielectric can mate to the metallic surface to enhance or adjust antenna beam characteristics such as main lobe width and sidelobe level. Thus for specific dielectric surface features, momentum wave vector matching (k-matching) options other than those of a dielectric constant or incident angle can be achieved as discussed above in FIGS. 2A and 2B.

Figure 3A:
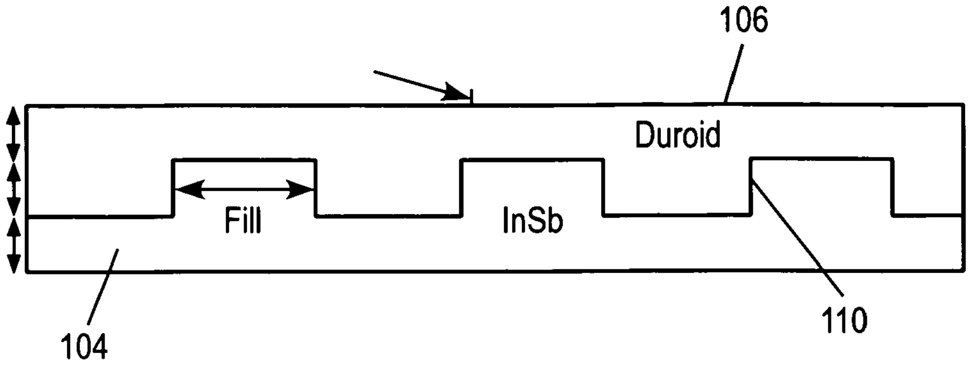
FIGS. 3A-3E illustrate exemplary surface features of dielectric and metallic layers.
Figure 3B:
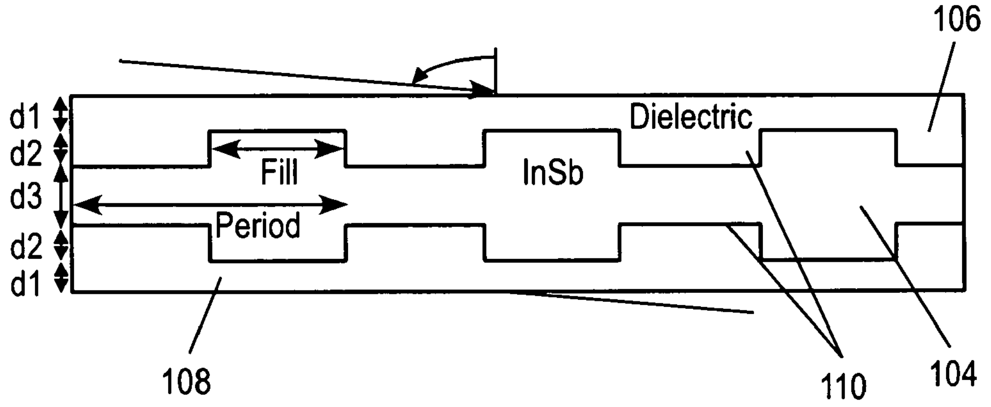
Figure 3C:
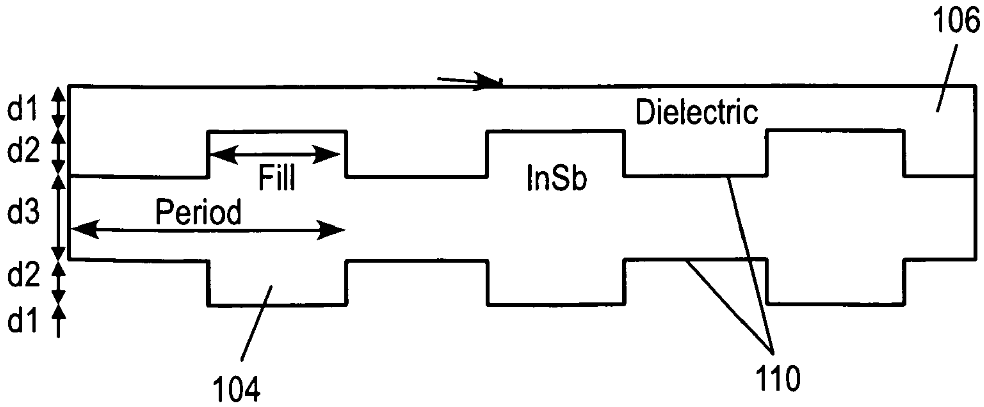
Figure 3D:
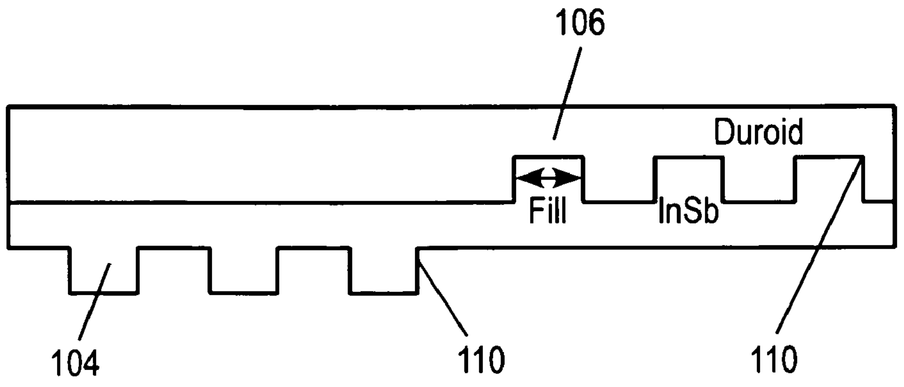
Figure 3E:
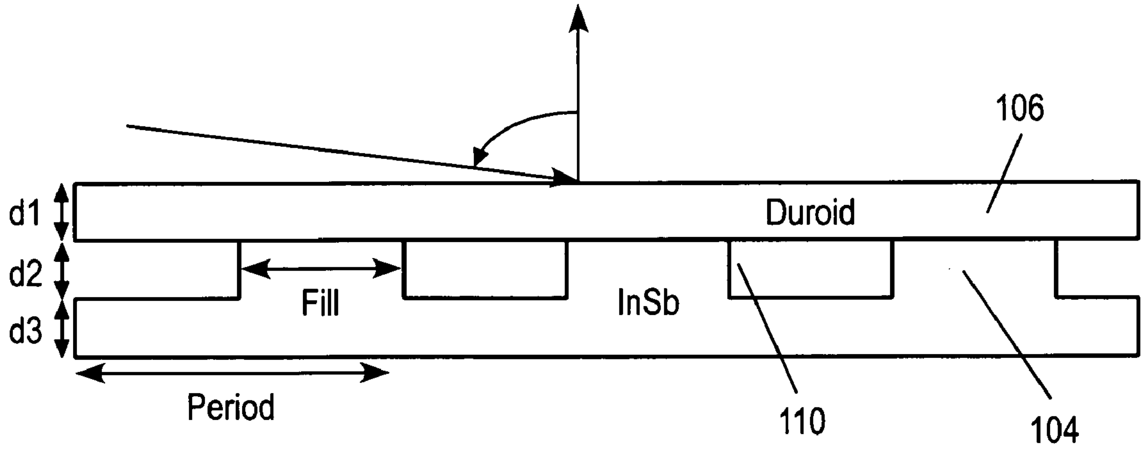

FIGS. 3A through 3C illustrate interface options between the metal layer 104 and the input and/or output dielectric layers 106, 108. In the example of FIG. 3A, a flat Duroid dielectric layer 106 is coupled to an indium antimonide (InSb) semiconductor layer 104. The semiconductor layer 104 has a grating applied to a surface that interfaces with the dielectric layer 106. As shown in FIG. 3B, a flat Duroid dielectric layer 106 is coupled to an indium antimonide (InSb) semiconductor layer 104 having a grating 110 applied to both surfaces. FIG. 3C illustrates a first flat Duroid dielectric layer 106 that is coupled to a surface of an indium antimonide (InSb) semiconductor layer 104. A second flat Duroid dielectric layer 108 is coupled to a surface of the semiconductor layer 104 that is opposite the first dielectric layer 106. In this example, the semiconductor layer 104 has a grating 110 applied to each surface that interfaces the first and second dielectric layers 106, 108. As shown in FIG. 3D, a flat Duroid dielectric layer 106 is coupled to an indium antimonide (InSb) semiconductor layer 104. The semiconductor layer 104 has a grating 110 applied to both surfaces in an alternating pattern. In the example of FIG. 3E, a flat Duroid dielectric layer 106 is coupled to an indium antimonide (InSb) semiconductor layer 104 having a grating applied to an interface between the layers. The gaps resulting at the interface are filled with air.

Sidelobe suppression is enhanced by a variety of factors. For example, in the case of gratings as the surface feature on any of the metal layer 104, the input dielectric layer 106, and the output dielectric layer 108, the greater the number of gratings over a finite antenna length, the greater is sidelobe suppression. The enhanced sidelobe suppression characteristic makes larger apertures, which allows more gratings, of particular value for beam transmission. The grating height between channels and peaks can also reduce sidelobe levels to a level that is also determined by wavelength of operation and material characteristics such as relevant material permittivity. As a result, an available device depth can be a design parameter that influences the amount of sidelobe suppression and/or beam steering. Feature “fill”, e.g. grating fill (width of peaks) and period contribute to peak incident angle reception and thus main beam direction.

Figure 4A:
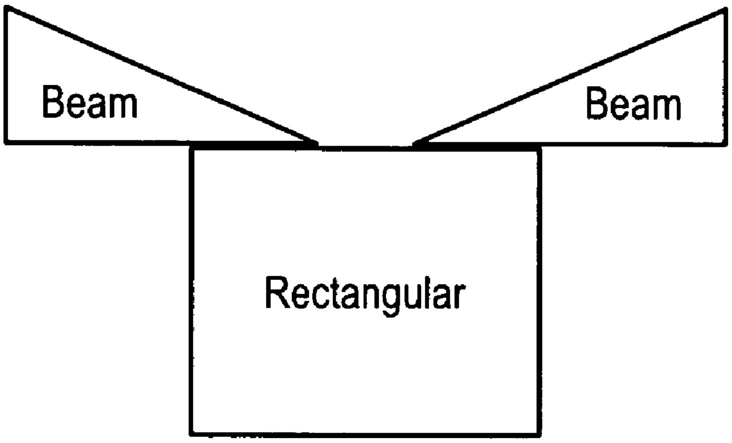
FIGS. 4A-4C illustrate exemplary metal layers for beamwidth tuning.
Figure 4B:
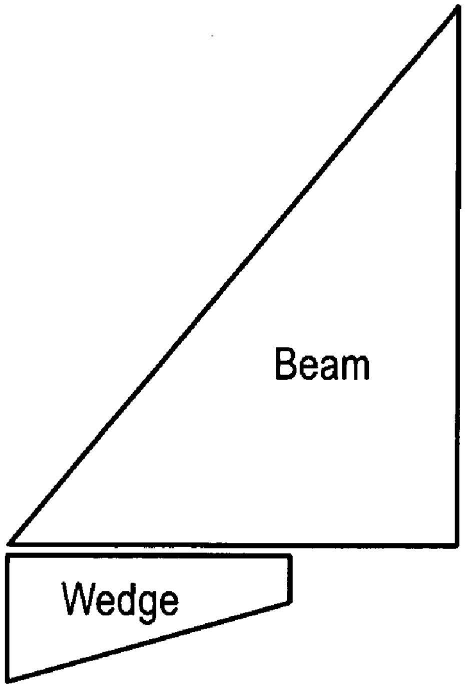
Figure 4C:
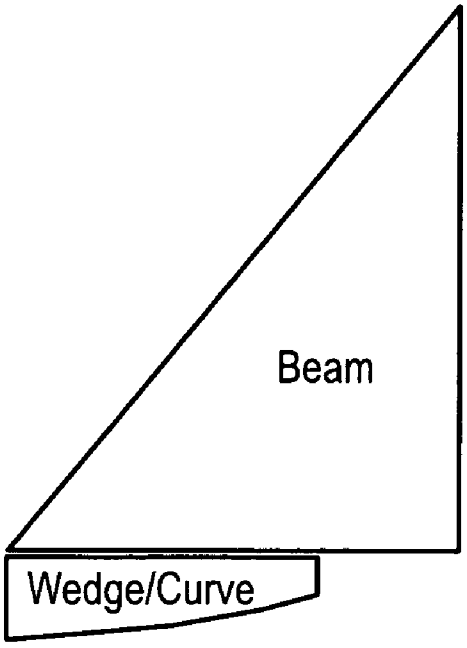

FIGS. 4A-4C illustrate exemplary metal layers 106 for beamwidth tuning. As shown in FIG. 4A, the metal layer 104 can have a substantially rectangular shape of a substantially uniform thickness. In this configuration, the metal layer 104 transmits nearly all EM energy incident of the first face 106*a*. The EM energy incident on the first face 106*a* satisfies a total internal reflection (TIR) requirement for resonance of the metal layer 104 so that two beams of limited beamwidth are produced.

As shown in FIG. 4B, the metal layer 104 can have a substantially wedge shape of varying thickness along the length of the first and second surfaces 106*a*, 106*b*. In this configuration, the metal layer 104 rejects EM energy that is not incident upon the first surface 104*a* at a predetermined angle. The EM energy that is incident on the first surface 104*a* at the predetermined angle resonates within a resonance region. The angle of the first surface 104*a* determines the location of the resonance region within the metal layer 104 such that any EM energy that is not incident upon the first surface 106 within an appropriate range of angles will be rejected (i.e., will not resonate). The EM energy exiting the metal layer 104 at the second surface 104*b* can have, for example, a 20° beamwidth for a resonance region at a width of 2.5°. In this configuration, the beamwidth cutoff angle can be controlled by the width of the resonance region (i.e., resonance width). Resonance width is a range of incident angles over which incident EM energy can resonate with (i.e. couple to) plasmons on a surface of the metal layer 104. Resonance width can be determined by beamwidth tuning as well as material choice.

As shown in FIG. 4C, the metal layer 104 can have a combined wedge/curve shape of varying thickness along the length of the first and second surfaces 106*a*, 106*b* respectively. The wedge/curve configuration can result in the rejection of EM energy that is not incident upon the first surface 104*a* at a predetermined angle, because the EM energy will not resonate in the resonance region. The EM energy exiting the metal layer at the second surface 104*b* can have, for example, a 30° beamwidth at a resonance width of 2.5°. The beamwidth cutoff angle can be controlled, for example, by various parameters such as the shape and characteristics of the material layers and a length of the antenna.

One of ordinary skill can appreciate the constraints on an antenna that can be realized based on the characteristics of the metal layer 104. For example, the material composition of the metal layer 104 can determine incident angle of the first surface 104*a* for achieving resonance. The angle of the first surface 104*a* can determine the cutoff angle of the EM energy and/or the location of the resonance area depending on the configuration. The curvature of the first surface 104*a* can also control the location of the resonance area.

To facilitate the transmission of EM energy at specific narrow angles in accordance with exemplary embodiments disclosed herein, the input and output dielectric layers 104, 108 and the metal layer 104 can encompass various characteristics.

For example, the metal layer 104 can be doped to a charge density so that an appropriate negative permittivity for a chosen transmit frequency is attained. The roughness of the first surface 104*a* of the metal layer 104, such as a grating, can be shaped (e.g., square, round) so that the EM energy can resonate at the second surface 104*b* at a predetermined frequency bandwidth. The momentum wave vector $k_{od}$ of the output dielectric 108 can be matched to the momentum wave vector $k_{m2}$ at the second surface 104*b* of the metal layer 104 based on a desired output angle of the EM energy to be transmitted. The momentum wave vector $k_{id}$ of the input dielectric 106 can be matched to the momentum wave vector $k_{m1}$ at the first surface 104*a* of the metal layer 104 based on the refractive index of the input dielectric 106 and the angle of incidence of the EM energy. The refractive index of the input dielectric 106 can be smaller than the refractive index of the output dielectric.

The outer surfaces of the input and output dielectrics 104, 108 can be configured (i.e. shaped) so that the EM energy has an appropriate angle of incidence at each of the respective outer surfaces of the input and output dielectric 104, 108.

Figure 5:
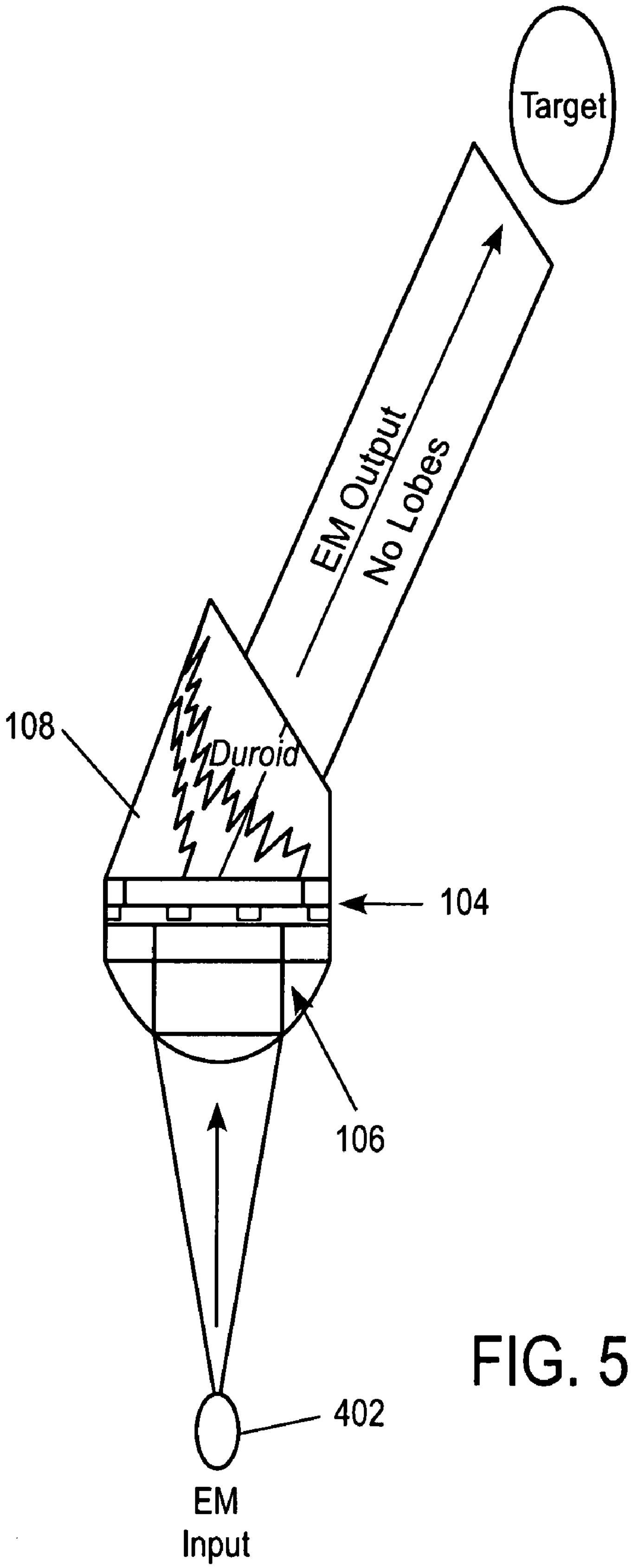
FIG. 5 illustrates an exemplary system 400 for emitting electromagnetic (EM) energy in a narrow field of view without side lobes.

FIG. 5 illustrates an exemplary system 400 for transmitting electromagnetic (EM) energy in a narrow beam (i.e., narrow relative to the EM energy supplied by a source), without side lobes. The system 400 includes a source 402 that supplies EM energy and an antenna 404 that directs the emitted EM energy to illuminate a target through a narrow beam having no side lobes. The antenna is configured as described in FIG. 1 such that a metal layer 104 is disposed between an input dielectric layer 106 and an output dielectric layer 108. The metal layer 104 includes a first surface 104*a* that is adjacent to an inner surface of the input dielectric layer 106 and a second surface 104*b* that is adjacent to an inner surface of the output dielectric layer 108. In this example, the metal layer 104 is configured to k-match Ka-band radio frequency energy with linear, rectangular gratings on an intrinsic (non-doped) indium antimonide semiconductor layer with period=3.5828 mm, fill=1.5772 mm, semiconductor thickness at grating channels=0.2250 mm, semiconductor thickness at grating peaks=0.2250 mm, a layer of Arlon CuClad (for thermal matching) of thickness 0.0381 mm over semiconductor peaks, and thickness 0.2631 mm over semiconductor channels, overlaid with flat Duroid of refraction index=1.53, and thickness 3.175 mm.

As shown in FIG. 5, the source 402 supplies EM energy on a surface of the antenna 404 at a predetermined angle. At the antenna, the material layers (104, 106, 108) are configured such that, as the EM energy travels between the material layers, at least a portion EM energy is coupled and emitted in a narrow beam devoid of side lobes towards a target. The interaction of the material layers based on any combination of the respective thickness, shape, and/or material composition of each layer determines the surface plasmon polaritons located on a surface of the metal layer that are to be stimulated to emit the EM beam.

Exemplary methods for illuminating a target with EM energy are also encompassed by the present discloser. Such an exemplary method includes supplying EM energy from an EM source; and focusing the EM energy into a narrow beam by using the EM energy to stimulate surface plasmon polariton on a metal layer located adjacent at least one dielectric layer.

One of ordinary skill can appreciate that the exemplary embodiments described herein enable the EM energy to be transmitted in various adverse environmental conditions such as rain, clouds, dust, fog, snow, or any other condition that can be considered unfavorable for energy transmission.

Moreover, it is understood that the exemplary embodiments can be implemented in various applications such as the transmission of communication signals and data (e.g., cellular or wireless communication), and energy transmission through solar panels.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What we claim is:

1. A system for emitting electromagnetic (EM) energy comprising:

a source of EM energy;

a first material that transmits incident EM energy emitted from the EM source; and a second material having a first surface adjacent to the first material and a thickness and shape selected to stimulate surface plasmon polaritons on the first surface of the second material adjacent the first material to resonate the EM energy transmitted from the first material such that the resonated EM energy has an EM wavelength in a narrow field of view with substantially no sidelobes.

2. The system of claim 1, wherein the second material is different from the first material.

3. The system of claim 1, wherein the first material is a dielectric.

4. The system of claim 1, wherein the second material is a metal having the first surface configured as a grating such that the selected thickness and shape stimulate the surface plasmon polaritons.

5. The system of claim 1, comprising a third material, wherein the second material has a second surface adjacent to the third material, and wherein the third material refracts the resonated EM energy towards a target.

6. An apparatus for emitting electromagnetic (EM) energy comprising:

a first material having a first surface and a second surface and configured to receive EM energy from an EM source; and a second material having a first surface and a second surface and configured relative to the first material to receive EM energy from the first material, wherein the first surface of at least one of the first and second materials includes an interface configured to resonate the EM energy received via the first material and to stimulate surface plasmon polaritons on at least one of the first and second surfaces of the second material in response to the EM energy, wherein the second material is configured to resonate the EM energy at a wavelength in a narrow field of view with substantially no sidelobes.

7. The apparatus of claim 6, wherein the second surface of the second material is configured to emit light that is incident at a predetermined angle.

8. The apparatus of claim 6, wherein at least one of the first and second surfaces of the second material includes a grating.

9. The apparatus of claim 8, wherein the grating is applied in an alternating pattern.

10. The apparatus of claim 6, wherein at least one of the first and second surfaces of the first material includes a grating.

11. The apparatus of claim 6, wherein at least one of the first surface and the second surface of the first material includes a grating and at least one of the first and second surfaces of the second material includes a grating.

12. The apparatus of claim 6, wherein the second material is of varying thickness, and wherein at least part of the second material has a wedge shape.

13. The apparatus of claim 12, wherein at least part of the second material has a curve shape.

14. A method for illuminating a target comprising:

supplying EM energy from an EM source; and focusing the EM energy into a narrow beam by using the EM energy to stimulate surface plasmon polaritons on a metal layer located adjacent at least one dielectric layer.

15. The method of claim 14, wherein the narrow beam has substantially no sidelobes.

16. An apparatus for emitting electromagnetic (EM) energy comprising:

a first material having a first surface and a second surface and configured to receive EM energy from an EM source; and a second material having a first surface and a second surface and configured relative to the first material to receive EM energy from the first material, wherein the first surface of at least one of the first and second materials includes an interface configured to resonate the EM energy received via the first material and to stimulate surface plasmon polaritons on at least one of the first and second surfaces of the second material in response to the EM energy, wherein at least one of the first and second surfaces of the first material includes a grating.

17. The apparatus of claim 16, wherein at least one of the first and second surfaces of the second material includes a grating.

* * * * *